(12) United States Patent
Tao et al.

(10) Patent No.: US 6,759,838 B2
(45) Date of Patent: Jul. 6, 2004

(54) PHASE-LOCKED LOOP WITH DUAL-MODE PHASE/FREQUENCY DETECTION

(75) Inventors: Kuang-Chung Tao, Hsinchu (TW); Chi-Ming Hsiao, Taichung (TW); Chang-Fu Kuo, HsinChu (TW)

(73) Assignee: Mediatek Inc., Hsin-chu (TW)

( * ) Notice: Subject to any disclaimer, the term of this patent is extended or adjusted under 35 U.S.C. 154(b) by 0 days.

(21) Appl. No.: 10/107,359

(22) Filed: Mar. 28, 2002

(65) Prior Publication Data
US 2002/0158621 A1 Oct. 31, 2002

(30) Foreign Application Priority Data
Apr. 27, 2001 (TW) ........................................ 90110228 A

(51) Int. Cl.[7] .......................... G01R 23/12; H04B 1/06; H03L 7/00; H03D 3/18; H03D 13/00
(52) U.S. Cl. ............................ 324/76.53; 324/76.74; 324/76.47; 324/76.82; 327/148; 455/260; 375/327
(58) Field of Search ............................. 375/374, 327, 375/328, 376, 373, 375; 327/147, 148, 156, 157, 2, 7, 150, 159; 331/1 R, 1 A; 455/260, 180.3, 182.1, 168.1, 160.1; 324/76.53, 76.52, 76.55, 76.68, 76.74, 76.41

(56) References Cited
U.S. PATENT DOCUMENTS

| | | | | |
|---|---|---|---|---|
| 5,057,793 A | * | 10/1991 | Cowley et al. | 331/1 A |
| 5,105,160 A | * | 4/1992 | Summers | 327/7 |
| 5,157,341 A | * | 10/1992 | Fobbester et al. | 327/7 |
| 6,163,585 A | * | 12/2000 | Yamawaki et al. | 375/373 |
| 6,501,259 B1 | * | 12/2002 | Cheng | 324/76.53 |

FOREIGN PATENT DOCUMENTS

TW     349291     1/1999

* cited by examiner

Primary Examiner—Anjan K. Deb
(74) Attorney, Agent, or Firm—Rabin & Berdo, P.C.

(57) ABSTRACT

A phase-locked loop with dual-mode phase/frequency detection is provided. The phase-locked loop circuit includes a dual-mode phase/frequency detector, a loop filter, a voltage-controlled oscillator, and a frequency converter. In addition, the dual-mode phase/frequency detector includes a digital phase/frequency detector, an analog phase/frequency detector, a charge pump, and a control unit. When the phase-locked loop circuit starts, the control unit causes a detection output signal from the dual-mode phase/frequency detector to correspond to a digital signal from the digital phase/frequency detector. When the phase-locked loop circuit approaches a lock state, the control unit causes the detection output signal to correspond to an analog signal from the analog phase/frequency detector. The phase-locked loop with dual-mode phase/frequency detection has the advantages of providing linear characteristics, fast switching speed, and high sensitivity.

20 Claims, 9 Drawing Sheets

US 6,759,838 B2

PHASE-LOCKED LOOP WITH DUAL-MODE PHASE/FREQUENCY DETECTION

This application incorporates by reference Taiwanese application Serial No. 90110228, filed on Apr. 27, 2001.

BACKGROUND OF THE INVENTION

1. Field of the Invention

The invention relates in general to a phase-locked loop, and more particularly to a phase-locked loop with dual-mode phase/frequency detection, which is suitable for use in wireless communication systems.

2. Description of the Related Art

A phase-locked loop (PLL) is a circuit, which generates a signal maintaining a constant phase and frequency relative to a reference signal. Phase-locked loops are widely used in wireless communications. For the years, as the wireless communications become more and more important, how to obtain a low-noise, high-speed PLL is an important topic for the industry.

Referring to FIG. 1, it is a block diagram illustrating a conventional PLL. In a wireless communication system, a PLL 100 is to convert an intermediate frequency (IF) signal into a radio frequency (RF) signal. The PLL 100 includes a phase/frequency detector (PFD) 102, a loop filter (LP) 104, a voltage-controlled oscillator (VCO) 106, and a frequency converter 110. The PFD 102 receives an input frequency $f_{IF}$ and a reference frequency $f_{ref}$, and compares the input frequency $f_{IF}$ with the reference frequency $f_{ref}$ so as to obtain an output signal S1 proportional to the phase difference between the input frequency $f_{IF}$ and the reference frequency $f_{ref}$. After the LP 104 filters the output signal S1 for removing undesired high-frequency components and noise from the output signal S1, the LP 104 outputs an output signal S2. The output signal S2 is then as an input to the VCO 106. The VCO 106 outputs an output frequency $f_{RF}$ as an output of the PLL 100. Besides, the output frequency $f_{RF}$ is fed into the frequency converter 110 through a coupler 108. The frequency converter 110 outputs a reference frequency $f_{ref}$ equal to a local signal frequency $f_{LO}$ minus the output frequency $f_{RF}$.

After initialization and the operation for a settling time, the PLL 100 enters a lock state in which the reference frequency $f_{ref}$ is equal to the input frequency $f_{IF}$ and the output frequency $f_{RF}$ is given by the local signal frequency $f_{LO}$ minus the input frequency $f_{RF}$.

When the PFD 102 of the PLL 100 is an analog PFD, the PLL 100 has a frequency response as shown in FIG. 2 after initialized. An analog PFD detector can be implemented by an analog multiplier. Besides, an analog PFD is characterized by a lock-in range. As an input to the analog PFD, the reference frequency $f_{ref}$ has to be within the lock-in range, such as the range between the frequencies $f_1$ and $f_2$ as shown in FIG. 2, so that the analog PFD operates properly to cause the reference voltage varying as the phase difference between the inputs of the analog PFD. As shown in from FIG. 2, after the PLL 100 is initiated, the reference frequency $f_{ref}$ varies for a settling time, and then the reference frequency $f_{ref}$ enters the lock-in range while the PLL 100 is in the lock state. Since the lock-in range for an analog PFD is narrow, it takes a long settling time for the PLL 100 from the start of control of the PLL 100 to the lock state. In this way, when the analog PFD is used in a situation where frequency switching is involved, the long settling time results in a low switching speed.

A PLL that has a reduced settling time so as to increase the switching speed is described in U.S. Pat. No. 6,163,585, where a constant current source is used to achieve the reduced settling time. However, for a PLL circuit according to U.S. Pat. No. 6,163,585, the amount of the current from the constant current source must be related to the output current of a phase comparator under a condition, that is, the rate of the former and the latter must be within a specific range. Otherwise, the PLL may not lock in.

On the other hand, if a digital PFD is substituted for the PFD 102 in FIG. 1, the problem of having a long settling time and a low switching time can be avoided. Referring to FIG. 3, it shows a frequency response of the PLL 100 with a digital PFD substituted for the analog one. As the digital PFD is started with the reference frequency $f_{ref}$ at an initial frequency $f_0$, it will cause the reference frequency $f_{ref}$, in a short time, to approach the input frequency $f_{IF}$. Since the lock-in range of a digital PFD is broad, the switching speed of the digital PFD is high. However, compared with the analog PFD, the digital PFD has the disadvantages of lower sensitivity, bad linearity, and the excessive noise in an in-band range. Therefore, the quality of the output signal of the PLL with the digital PFD is degraded.

In order to specify the differences between the conventional analog and digital FPDs, FIGS. 4A and 4B are two diagrams showing the relation between the phase differences and average currents of the output signals of the conventional analogy PFD and the conventional digital PFD respectively. In FIG. 4A, the average output current from the analog PFD, denoted by $I_{ave\_A}$, is fully linearly dependent on the phase difference θ of the input frequency $f_{IF}$ and the reference frequency $f_{ref}$, which corresponds to a straight line $L_A$ through the origin O as shown in FIG. 4A. In FIG. 4B, the average output current from the digital PFD, denoted by $I_{ave\_D}$, is partially linearly dependent on the phase difference θ of the input frequency $f_{IF}$ and the reference frequency $f_{ref}$. That is, as shown in FIG. 4B, when the phase difference θ is between θ1 and θ2, $I_{ave\_D}$ is almost equal to zero. In this way, when the phase difference is a small value, it may occur that the digital PFD cannot discriminate between the phases of the input frequency $f_{IF}$ and the reference frequency $f_{ref}$. Since the analog PFD provides high linearity, the PLL using the analog PFD, as being locked in, obtains the reference frequency $f_{ref}$ much more close to the input frequency $f_{IF}$. Compared with the digital PFD, the analog PFD has lower in-band noise and better sensitivity to phase difference so that the output signal of the PLL at the output frequency $f_{RF}$ has good quality.

Hence, since the digital PFD has the deficient sensitivity to phase difference, the output signal of the PLL with the digital PFD has greater in-band noise than that of the PLL with the analog PFD. Referring to FIG. 5, it shows a frequency spectrum of the output frequency of a conventional PLL with the digital PFD. When the phase difference is in the range from θ1 to θ2, the digital PFD is unable to discriminate between its inputs so that the output signal of the PLL using the digital PFD becomes a signal centered at frequency $f_{RF0}$ with bandwidth between $f_3$ and $f_4$, wherein $f_{RF0}$ is given by the local signal frequency $f_{LO}$ minus the input frequency $f_{IF}$. Thus, it results in the degradation of the output signal of the PLL.

SUMMARY OF THE INVENTION

It is therefore an object of the invention to provide a phase-locked loop (PLL) circuit with dual-mode phase/frequency detection. By using the PLL with dual-mode phase/frequency detection, the problem that the conventional PLL using an analog phase/frequency detector provides a low switching speed is avoided. In addition, the PLL with dual-mode phase/frequency detection has the advantages of providing linear characteristics, increased switching speed, and high sensitivity.

According to the object of the invention, a phase-locked loop circuit with dual-mode phase/frequency detection is provided. The phase-locked loop circuit includes a dual-mode phase/frequency detector, a loop filter, a voltage-controlled oscillator, and a frequency converter. The dual-mode phase/frequency detector is to receive an input frequency and a reference frequency, and to obtain a detection output signal corresponding to the phase difference between the input frequency and the reference frequency. The loop filter is for filtering the detection output signal to output a filtered detection output signal. The voltage-controlled oscillator is coupled to the loop filter and is used for outputting an output frequency according to the filtered detection output signal. The frequency converter is used for receiving the output frequency and outputting the reference frequency, wherein the reference frequency corresponds to the output frequency. In addition, the dual-mode phase/frequency detector includes a digital phase/frequency detector, an analog phase/frequency detector, a charge pump, and a control unit. The digital phase/frequency detector is used for outputting a digital signal according to the input frequency and the reference frequency. The analog phase/frequency detector is used for outputting an analog signal according to the input frequency and the reference frequency. The charge pump is coupled to the digital phase/frequency detector and the analog phase/frequency detector, and is used for outputting the detection output signal corresponding to the phase difference between the input frequency and the reference frequency. The control unit is used for controlling the digital phase/frequency detector and the analog phase/frequency detector. When the phase-locked loop circuit starts, the control unit causes the detection output signal to correspond to the digital signal, and when the phase-locked loop circuit approaches a lock state, the control unit causes the detection output signal to correspond to the analog signal.

Other objects, features, and advantages of the invention will become apparent from the following detailed description of the preferred but non-limiting embodiments. The description is made with reference to the accompanying drawings described as follows.

DESCRIPTION OF THE PREFERRED EMBODIMENT

According to the invention, a phase-locked loop (PLL) circuit employs a dual-mode phase/frequency detector (dual-mode PFD). The spirit of the invention is that the dual-mode PFD includes a digital PFD and an analog PFD. In addition, a control unit is used to select either one of the digital or analog PFD so as to obtain an output signal of the dual-mode PFD. When the PLL starts, the control unit selects the digital PFD. Afterwards, the control unit selects the analog PFD in order to cause the PLL to enter a lock state. In this way, the advantages of providing linear characteristics, increased switching speed, and high sensitivity are achieved.

Figure 1:
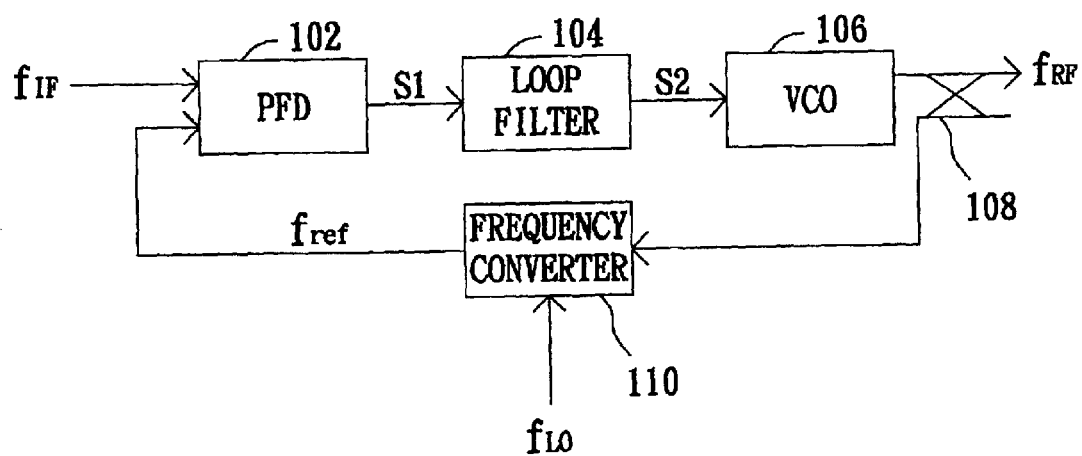
FIG. 1 (Prior Art) is a block diagram illustrating a conventional phase-locked loop.
Figure 2:
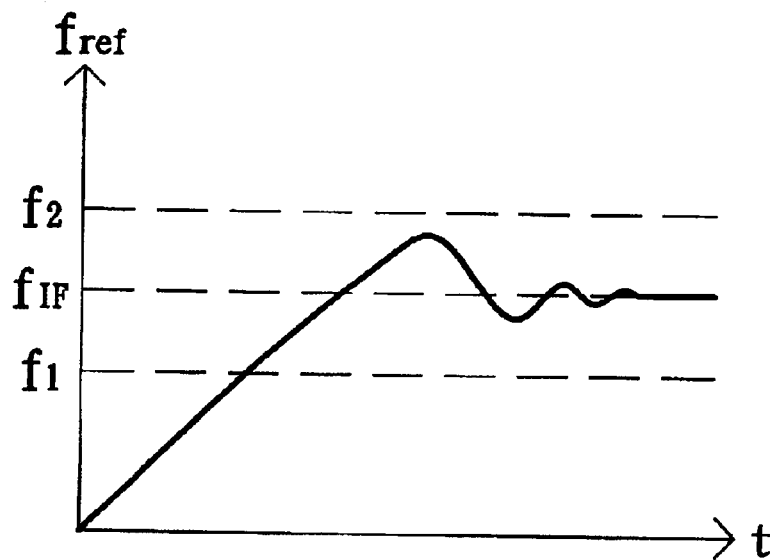
FIG. 2 (Prior Art) is a transient response of the phase-locked loop shown in FIG. 1 after starting, wherein the phase/frequency detector of the phase-locked loop is an analog phase/frequency detector.
Figure 3:
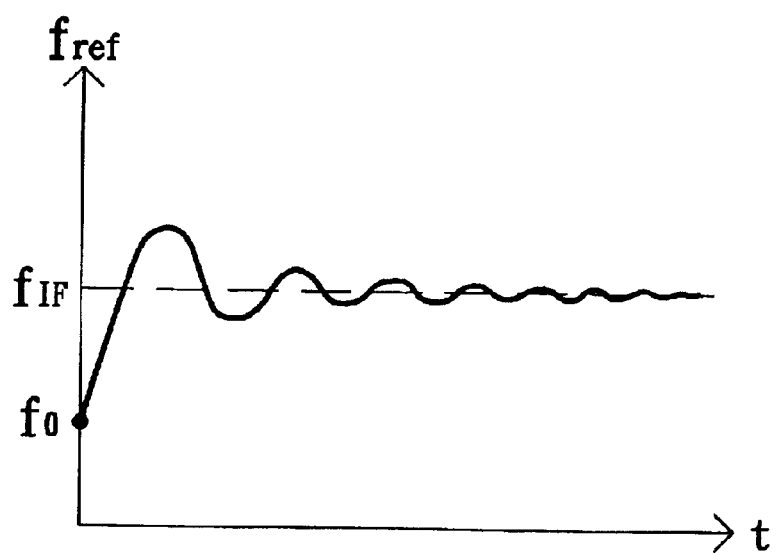
FIG. 3 (Prior Art) is a transient response of a conventional phase-locked loop which uses a digital phase/frequency detector.
Figure 4A:
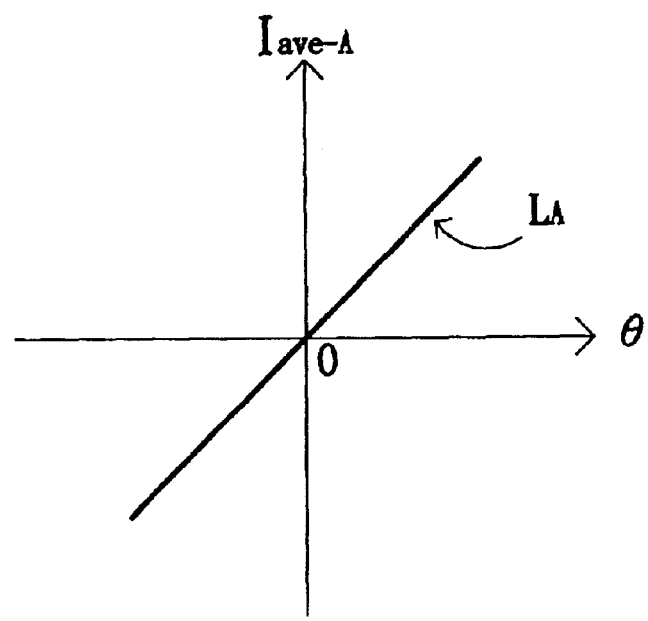
FIG. 4A (Prior Art) is a graph of the average output current from the analog phase/frequency detector, $I_{ave\_A}$, versus the phase difference θ between the two inputs of the analog phase/frequency detector, the input frequency $f_{IF}$ and the reference frequency $f_{ref}$.
Figure 4B:
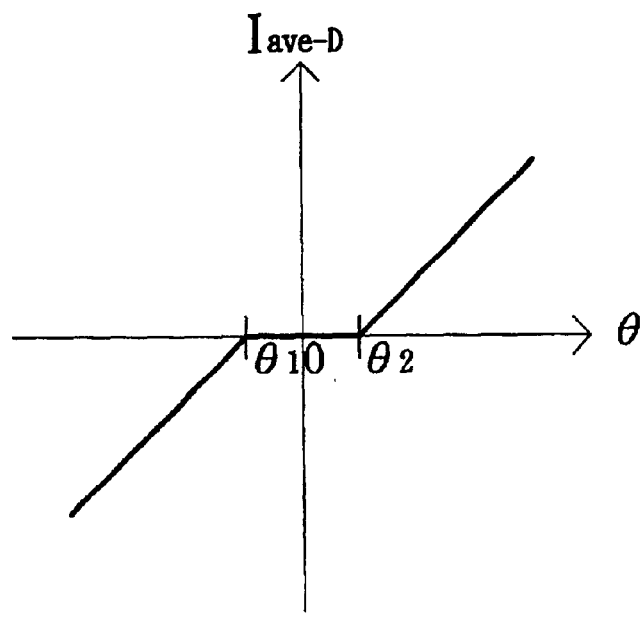
FIG. 4B (Prior Art) is a graph of the average output current from the digital phase/frequency detector, $I_{ave\_D}$, versus the phase difference θ between the two inputs of the digital phase/frequency detector, the input frequency $f_{IF}$ and the reference frequency $f_{ref}$.
Figure 5:
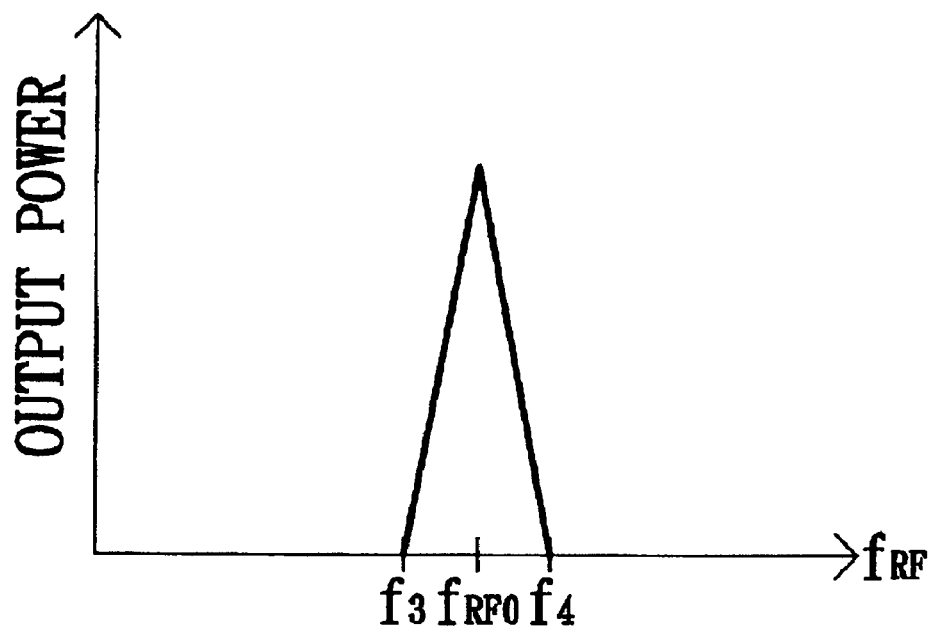
FIG. 5 (Prior Art) is a frequency spectrum of the output frequency of a conventional phase-locked look with the digital phase/frequency detector.
Figure 6:
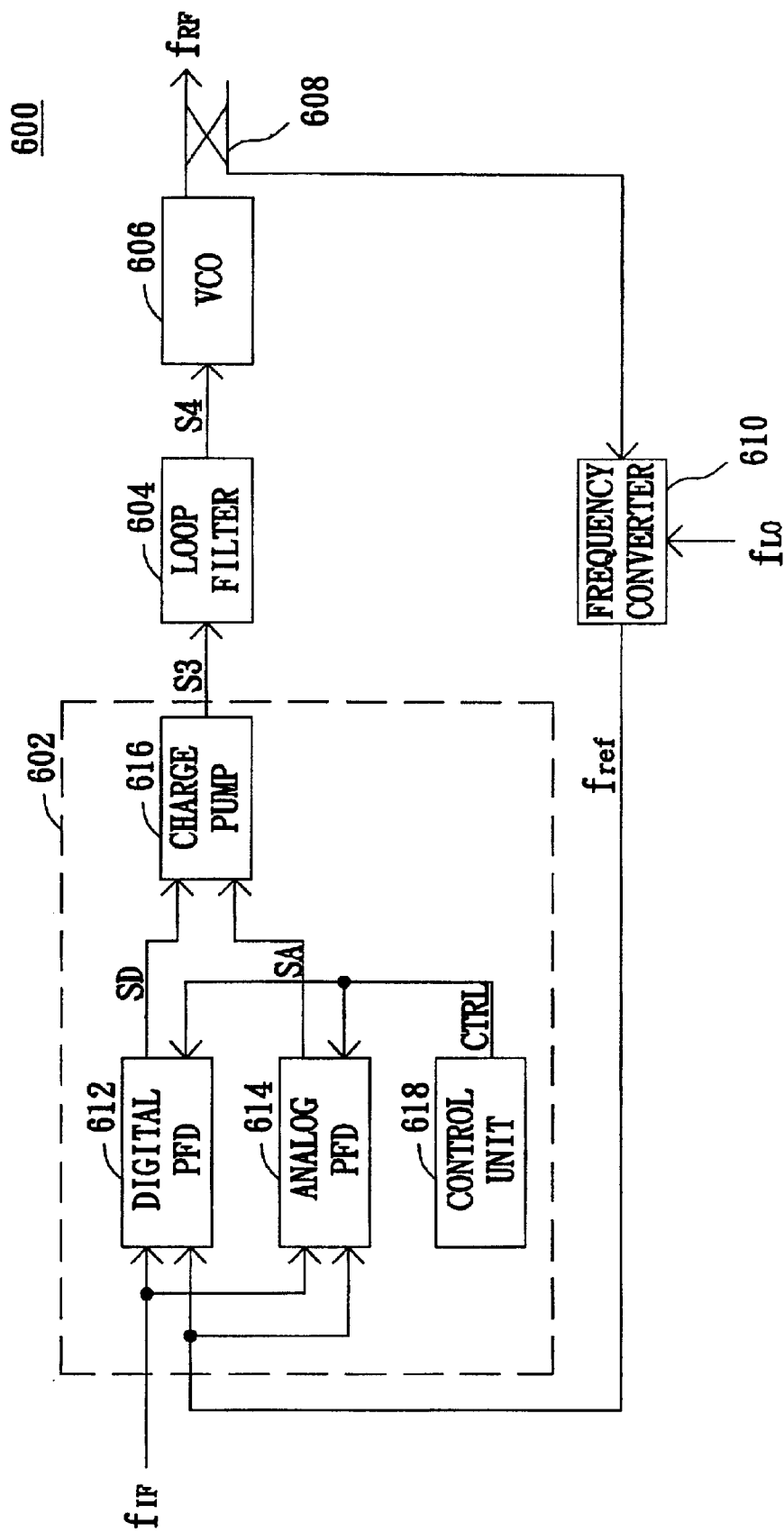
FIG. 6 is a block diagram of a phase-locked look using a dual-mode phase/frequency detector according to a preferred embodiment of the invention.

Referring to FIG. 6, it shows a block diagram of a PLL using a dual-mode PFD according to a preferred embodiment of the invention. A PLL 600 includes a dual-mode PFD 602, a loop filter 604, a voltage-controlled oscillator (VCO) 606, and a frequency converter 610 through a coupler 608. The dual-mode PFD 602 is used for receiving an input frequency $f_{IF}$ and a reference frequency $f_{ref}$ so as to obtain a detection output signal S3, wherein the detection output signal S3 corresponds to the phase difference between the input frequency $f_{IF}$ and the reference frequency $f_{ref}$. The detection output signal S3 is applied to the loop filter 604 for removing undesired frequency components and noise. The output signal S4 of the loop filter 604 is as an input of the VCO 606. The output frequency $f_{RF}$ of the VCO 606 is used as an output of the PLL 600. Besides, the output frequency $f_{RF}$ is applied to the frequency converter 610 through a coupler 608. The frequency converter 610 outputs the reference frequency $f_{ref}$ that is equal to a local signal frequency $f_{LO}$ minus the output frequency $f_{RF}$. In addition, the frequency converter 610 is implemented by using, for example, a frequency conversion mixer or a frequency divider.

The dual-mode PFD 602 includes a digital PFD 612, an analog 614, a charge pump 616, and a control unit 618. The digital PFD 612 is used to receive the input frequency $f_{IF}$ and the reference frequency $f_{ref}$, and output a digital signal SD. The analog PFD is used to receive the input frequency $f_{IF}$ and the reference frequency $f_{ref}$, and output an analog signal SA. The charge pump 616 is employed to receive the digital signal SD and analog signal SA, and output a detection output signal S3, wherein the detection output signal corresponds to the phase difference between the input frequency $f_{IF}$ and the reference frequency $f_{ref}$. In order to control the digital PFD 612 and the analog PFD 614, the control unit 618 outputs a control signal CTRL to the digital PED 612 and the analog PFD so that the digital signal SD and analog signal SA are outputted according to the control signal CTRL. When the PLL 600 starts, the control unit 618 selects the digital PFD 612 so that the detection output signal S3 corresponds to the digital signal SD. Afterwards, when the PLL 600 to enters the lock state, the control unit 618 selects the analog PFD 614 so that the detection output signal S3 corresponds to the analog signal SA. When the PLL 600 is in the lock state, the reference frequency $f_{ref}$ is equal to the input frequency $f_{IF}$ and the output frequency $f_{RF}$ is equal to the local signal frequency $f_{LO}$ minus the input frequency $f_{IF}$.

Figure 7:
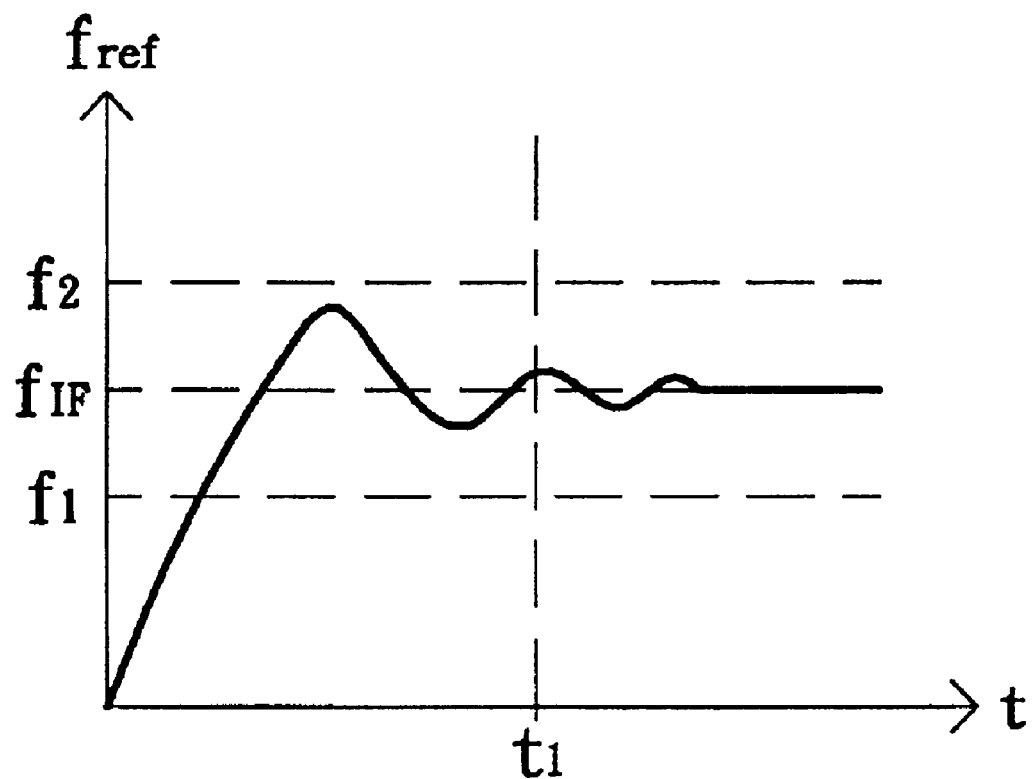
FIG. 7 is a transient response of the phase-locked look shown in FIG. 6 after the phase-locked look starts.

Referring to FIG. 7, it shows a transient frequency response of the PLL shown in FIG. 6 after the PLL starts. As described above, the digital PFD 612 has a fast switching speed, while the analog PFD 614 has linear characteristics and lower in-band noise. In addition, the detection output signal S3 corresponds to the digital signal SD when the PLL 600 starts. In this way, after the PLL 600 starts, the reference frequency $f_{ref}$, which corresponds to the output frequency $f_{RF}$, rapidly rises towards the input frequency $f_{IF}$ and then swings within the lock-in range (between frequencies $f_1$ to $f_2$). After time $t_1$, the detection output signal S3 is made corresponding to the analog signal SA. Thus, the reference frequency $f_{ref}$ approaches the input frequency $f_{IF}$ so that the PLL 600 enters the lock state. Besides, since the analog PFD provides lower in-band noise and better sensitivity, the output signal of the PLL 600 with the output frequency $f_{RF}$ has a good signal quality.

For determination as to whether the time $t_1$ is reached, there are many methods such as the following two approaches. The first approach is to use a timing controller in the control unit 618. In this approach, the control unit 618 includes the timing controller such as a counter where a predetermined number is set. When the timing controller counts up to a predetermined time, the control unit 618 changes from the state of using the digital PFD 612 to the state of using the analog PFD 614, wherein the predetermined time can be set to the time $t_1$.

The second approach is to use a lock indicator in the control unit 618. In this approach, the control unit 618 includes the lock indicator, which is used for indicating whether the reference frequency $f_{ref}$ is within the lock-in range of the analog PFD 614. If so, the control unit 618 changes from the state of using the digital PFD 612 to the state of using the analog PFD 614, wherein the time $t_1$ is set to a point of time when the reference frequency $f_{ref}$ enters the lock-in range of the analog PFD 614.

Figure 8:
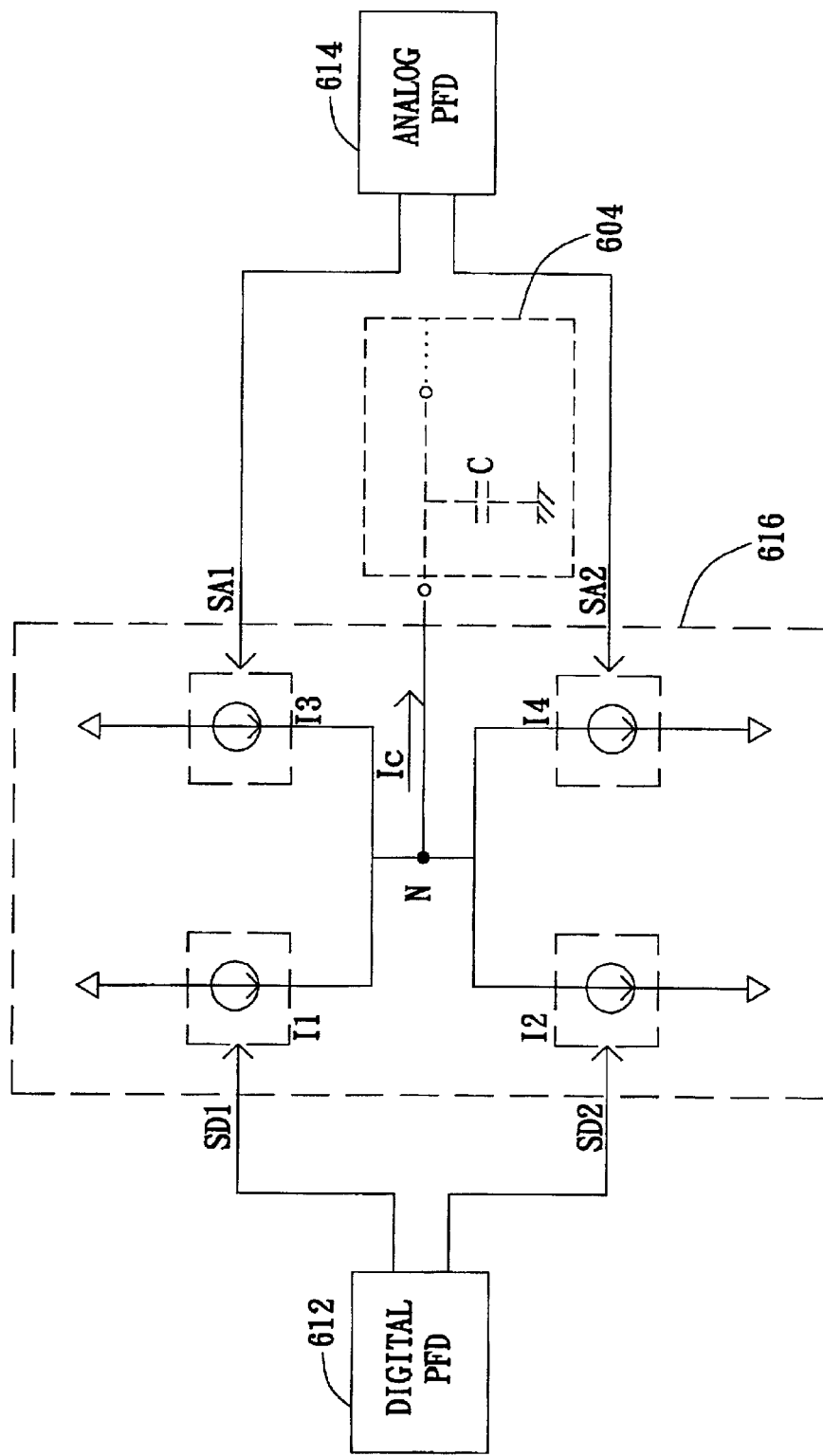
FIG. 8 is a circuit diagram illustrating the charge pump of the phase-locked look in FIG. 6.

Referring to FIG. 8, it shows a circuit diagram of the charge pump shown in FIG. 6. The charge pump 616 includes current sources I1, I2, I3, and I4. The digital signal SD from the digital PFD 612 includes digital signals SD1 and SD2. The digital signals SD1 and SD2 are used to control the current sources I1 and I2 respectively. The analog signal SA from the analog PFD 614 includes analog signals SA1 and SA2. The analog signals SA1 and SA2 are used to control the current sources I3 and I4 respectively. Suppose that the input stage of the loop filter 604, which is electronically coupled to the charge pump 616, has an equivalent capacitor C. The current sources I1 and I3 are connected in parallel at node N and the current sources I2 and I4 are also connected in parallel at node N. Besides, node N is connected to the loop filter 604 whose input stage is characterized by the equivalent capacitance C. Thus, the current sources I1 and I3 are used to charge the capacitor C whereas the current sources I2 and I4 are used to discharge the capacitor C.

Furthermore, when the control unit 618 selects the digital PFD 612, the control unit 618 causes the digital PFD 612 to enable the digital signals SD1 and SD2 from the digital PFD 612 so that the current source I1 charges or the current source I2 discharges the capacitor C during different time periods, wherein the currents from the current sources I1 and I2 are constant currents. At the same time, the control unit 618 causes the analog PFD 614 to output the analog signals SA1 and SA2 from the analog PFD 614 in very small values so that the output currents of the current sources I3 and I4 is too small to affect the voltage of the capacitor C.

Figure 9A:
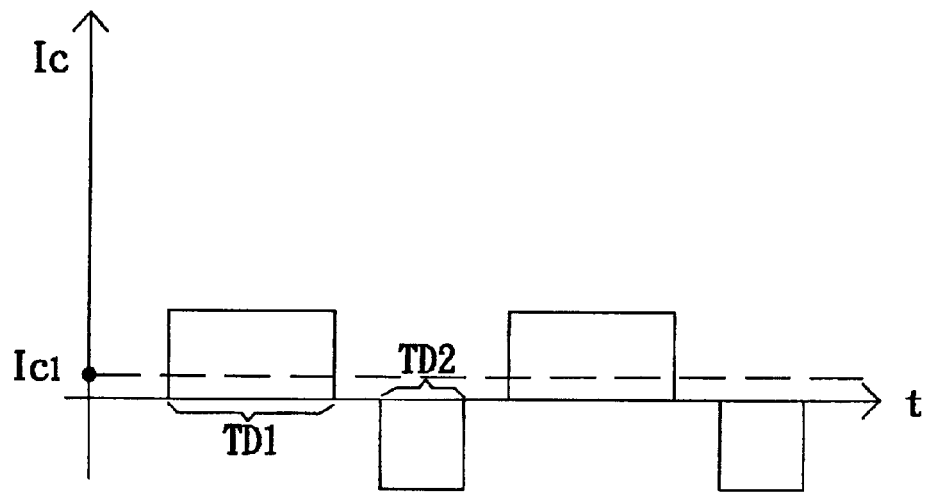
FIG. 9A shows a waveform diagram of the current $I_c$ flowing through the equivalent capacitor C of the loop filter shown in FIG. 8 when the control unit of the phase-locked loop selects the digital phase/frequency detector of the phase-locked loop, and the phase difference between the input frequency $f_{IF}$ and the reference frequency $f_{ref}$ is positive.
Figure 9B:
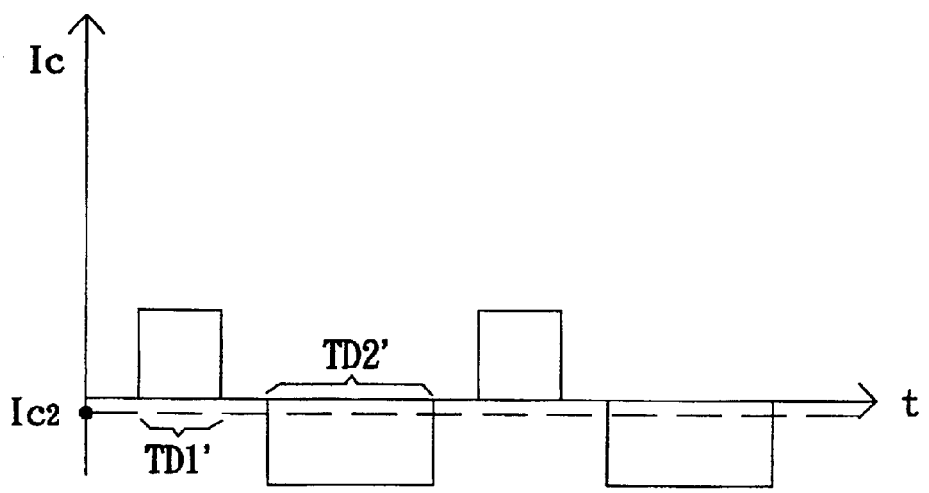
FIG. 9B shows a waveform diagram of the current $I_c$ flowing through the equivalent capacitor C of the loop filter of the phase-locked loop in FIG. 6 when the control unit of the phase-locked loop selects the digital phase/frequency detector of the phase-locked loop, and the phase difference between the input frequency $f_{IF}$ and the reference frequency $f_{ref}$ is negative.

Referring now to FIGS. 9A and 9B, they illustrate waveform diagrams of the current $I_c$ flowing through the capacitor C when the control unit 618 selects the digital PFD 612, and the phase difference between the input frequency $f_{IF}$ and the reference frequency $f_{ref}$ are positive and negative respectively. When the control unit 618 selects the digital PFD 612, the current $I_c$ is mainly supplied by the current sources I1 and I2. In order to obtain different average values of the current $I_C$ as the input of the loop filter 604, it is to change the operation periods of the current sources I1 and I2. For example, in FIG. 9A, when the input frequency $f_{IF}$ leads the reference frequency $f_{ref}$ in phase, the time period TD1 during which the current source I1 conducts is greater than the time period TD2 during which the current source I2 conducts. Thus, the current $I_C$ has a positive average $I_{C1}$ in FIG. 9A. In FIG. 9B, when the input frequency $f_{IF}$ lags the reference frequency $f_{ref}$ in phase, the time period TD1' during which the current source I1 conducts is less than the time period TD2' during which the current source I2 conducts. The current $I_C$ has a negative average $I_{C2}$.

On the other hand, when the control unit 618 selects the analog PFD 614, the control unit 618 controls the analog PFD 614 so as to output the analog signals SA1 and SA2 which are related to the phase difference between the input frequency $f_{IF}$ and the reference frequency $f_{ref}$. Besides, the current sources I3 and I4 generate constant currents that are proportional to the analog signal SA1 and SA2. Thus, the output currents of the current sources I3 and I4 can be used for charging or discharging the capacitor C in different strength by changing the values of the analog signal SA1 and SA2. At the same time, the control unit 618 causes the digital PFD 612 to disable the digital signals SA1 and SA2 so that the current sources I1 and I2 cannot affect the voltage across the capacitor C.

Figure 10A:
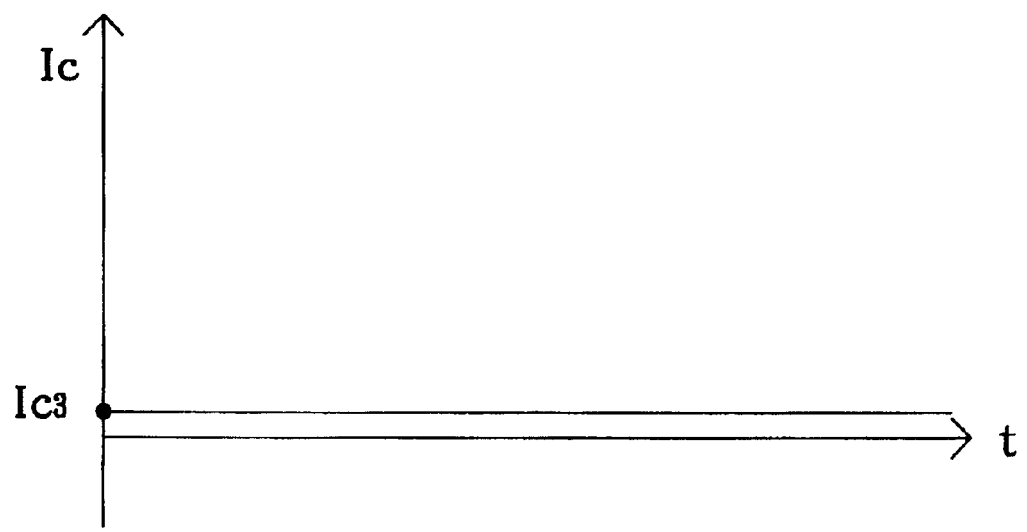
FIG. 10A is a waveform diagram of the current $I_c$ flowing through the equivalent capacitor C of the loop filter of the phase-locked loop in FIG. 6 when the control unit of the phase-locked loop selects the analog phase/frequency detector of the phase-locked loop, and the phase difference between the input frequency $f_{IF}$ and the reference frequency $f_{ref}$ is positive.
Figure 10B:
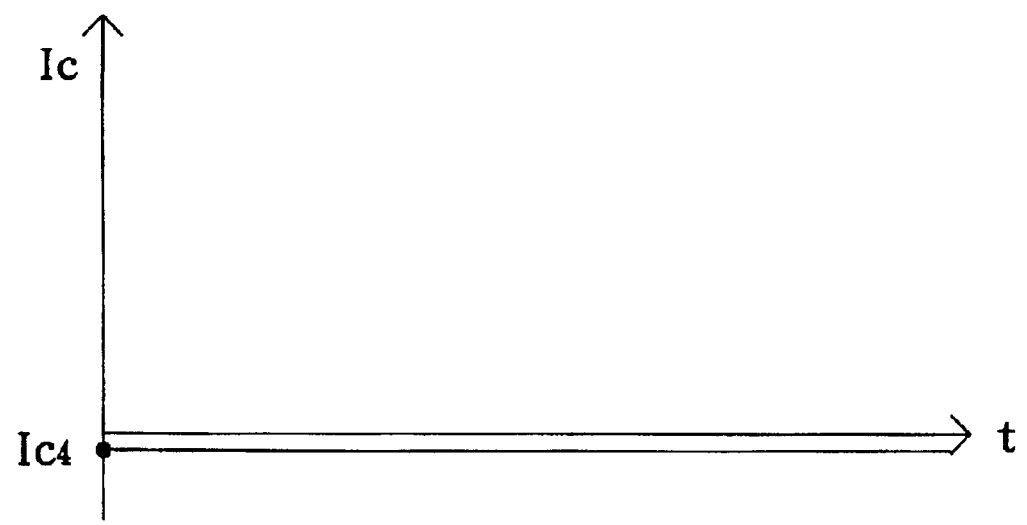
FIG. 10B is a waveform diagram of the current $I_c$ flowing through the equivalent capacitor C of the loop filter of the phase-locked loop in FIG. 6 when the control unit of the phase-locked loop selects the analog phase/frequency detector of of the phase-locked loop, and the phase difference between the input frequency $f_{IF}$ and the reference frequency $f_{ref}$ is negative.

Referring to FIGS. 10A and 10B, they illustrate waveform diagrams of the current $I_C$ flowing through the capacitor C when the control unit 618 selects the analog PFD 614, and the phase difference between the input frequency $f_{IF}$ and the reference frequency $f_{ref}$ are positive and negative respectively. When the control unit 618 selects the analog PFD 614, the current $I_C$ is mainly supplied by the current sources I3 and I4. In order to obtain different average values of the current $I_C$ as the input of the loop filter 604, it is to change the output current values of the current sources I3 and I4. For example, in FIG. 10A, when the input frequency $f_{IF}$ leads the reference frequency $f_{ref}$ in phase, the output current of the current sources I3 is greater than the output current of the current source I4 so that the current $I_C$ has a positive average $I_{C3}$. In FIG. 10B, when the input frequency $f_{IF}$ lags the reference frequency $f_{ref}$ in phase, the output current of the current sources I3 is smaller than the output current of the current source I4 so that the current $I_C$ has a negative average $I_{C4}$.

Although the structure of the charge pump shown in FIG. 8 is used in the illustrating of the operation of the embodiment, it is not to restrict the invention to using this charge pump. For example, the charge pump 616 can also be controlled by the control unit 618 for changing the operation of current sources I1, I2, I3, and I4. According to the invention, any charge pump which can correspond to the digital signal of the digital PFD 612 and the analog signal of the analog PFD 614 can be used in the invention and is covered under the scope of the invention.

The PLL with a dual-mode PFD can be used in a wireless communication system, such as the transmitter of the wireless communication system. In addition, the analog PFD 612 can be implemented by using an analog multiplier while the digital PFD 614 can be arbitrary digital PFD. In implementation, the dual-mode PFD 602 can be the combination of separate digital and analog phase/frequency detectors. Alternatively, the dual-mode PFD 602 can be implemented by the integrating of the digital and analog phase/frequency detectors. Further, since the digital PFD is mainly used in the start of the PLL, it is unnecessary to process the in-band noise produced by the digital PFD. Thus, in the implementation of the invention, the requirements for the digital PFD need not to be overly restricted by, for example, the in-band noise. Therefore, a high-cost digital PFD can be avoided in the implementation of the invention.

As described in the embodiment above, the PLL with the dual-mode PFD can avoid the problem of low switching speed in the conventional PLL with the analog PFD. In addition, the PLL with the dual-mode PFD provides fast switching speed, high linear characteristics, and high sensitivity.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A phase-locked loop circuit, for receiving an input frequency and a reference frequency, the phase-locked loop circuit comprising:
   a dual-mode phase/frequency detector, comprising:
      a digital phase/frequency detector for receiving the input frequency and the reference frequency, and outputting a digital signal according to the input frequency and the reference frequency;
      an analog phase/frequency detector for receiving the input frequency and the reference frequency, and outputting an analog signal according to the input frequency and the reference frequency;
      a charge pump, coupled to the digital phase/frequency detector and the analog phase/frequency detector, for receiving the digital signal from the digital phase/frequency detector and the analog signal from the analog digital phase/frequency detector, and outputting a detection output signal corresponding to a phase difference between the input frequency and the reference frequency; and
      a control unit for controlling the digital phase/frequency detector and the analog phase/frequency detector, wherein when the phase-locked loop circuit starts, the control unit selects the digital phase/frequency detector to generate the digital signal to the charge pump, and when the phase-locked loop circuit approaches a lock state, the control unit selects the analog phase/frequency detector to generate the analog signal to the charge pump;
   a loop filter for filtering the detection output signal and outputting a filtered detection output signal;
   a voltage-controlled oscillator, coupled to the loop filter, for outputting an output frequency according to the filtered detection output signal; and
   a frequency converter for receiving the output frequency and outputting the reference frequency, wherein the reference frequency corresponds to the output frequency.

2. A phase-locked loop circuit according to claim 1, wherein the control unit comprises a timing controller, when the phase-locked loop circuit starts, the control unit selects the digital phase/frequency to generate the digital signal to the charge pump, and after a predetermined time elapses from the start of the phase-locked loop circuit, the control unit selects the analog phase/frequency detector to generate the analog signal to the charge pump.

3. A phase-locked loop circuit according to claim 2, wherein the timing controller is a counter.

4. A phase-locked loop circuit according to claim 1, wherein the control unit comprises a lock indicator, the analog phase/frequency detector has a lock-in range, the lock indicator is used to indicate whether the reference frequency is within the lock-in range, when the phase-locked loop circuit starts, the control unit selects the digital phase/frequency detector to generate the digital signal to the charge pump, and when the reference frequency is within the lock-in range, the control unit selects the analog phase/frequency detector to generate the analog signal to the charge pump.

5. A phase-locked loop circuit according to claim 1, wherein the phase-locked loop circuit is for use in a wireless communication system.

6. A phase-locked loop circuit according to claim 1, wherein the phase-locked loop circuit is for use in a transmitter of a wireless communication system.

7. A phase-locked loop circuit according to claim 1, wherein the charge pump comprises a first current source, a second current source, a third current source, and a fourth current source, the first and second current sources are controlled by the digital phase/frequency detector, the third and fourth current sources are controlled by the analog phase/frequency detector, the first and third current sources are used to charge the loop filter, and the second and fourth current sources are used to discharge the loop filter.

8. A dual-mode phase/frequency detector, for use in a phase-locked loop circuit, the dual-mode phase/frequency detector receiving an input frequency and a reference frequency, the dual-mode phase/frequency detector comprising:

a digital phase/frequency detector for receiving the input frequency and the reference frequency, and outputting a digital signal according to the input frequency and the reference frequency;

an analog phase/frequency detector for receiving the input frequency and the reference frequency, and outputting an analog signal according to the input frequency and the reference frequency;

a charge pump, coupled to the digital phase/frequency detector and the analog phase/frequency detector, for receiving the digital signal from the digital phase/frequency detector and the analog signal from the analog digital phase/frequency detector, and outputting a detection output signal as an output of the dual-mode phase/frequency detector, wherein the detection output signal corresponds to a phase difference between the input frequency and the reference frequency; and a control unit for controlling the digital phase/frequency detector and the analog phase/frequency detector, wherein when the phase-locked loop circuit starts, the control unit selects the digital phase/frequency detector to generate the digital signal to the charge pump, and when the phase-locked loop circuit approaches a lock state, the control unit selects the analog phase/frequency detector to generate the analog signal to the charge pump.

9. A dual-mode phase/frequency detector according to claim 8, wherein the control unit comprises a timing controller, when the phase-locked loop circuit starts, the control unit selects the digital phase/frequency detector to generate the digital signal to the charge pump, and after a predetermined time elapses from the start of the phase-locked loop circuit, the control unit selects the analog phase/frequency detector to generate the analog signal to the charge pump.

10. A dual-mode phase/frequency detector according to claim 9, wherein the timing controller is a counter.

11. A dual-mode phase/frequency detector according to claim 8, wherein the control unit comprises a lock indicator, the analog phase/frequency detector has a lock-in range, the lock indicator is used to indicate whether the reference frequency is within the lock-in range, when the phase-locked loop circuit starts, the control unit selects the digital phase/frequency detector to output the digital signal to the charge pump, and when the reference frequency is within the lock-in range, the control unit selects the analog phase/frequency detector to output the analog signal to the change pump.

12. A dual-mode phase/frequency detector according to claim 8, wherein the dual-mode phase/frequency detector is for use in a wireless communication system.

13. A dual-mode phase/frequency detector according to claim 8, wherein the dual-mode phase/frequency detector is for use in a transmitter of a wireless communication system.

14. A dual-mode phase/frequency detector according to claim 8, wherein the charge pump comprises a first current source, a second current source, a third current source, and a fourth current source, the first and second current sources are controlled by the digital phase/frequency detector, the third and fourth current sources are controlled by the analog phase/frequency detector, the first and third current sources are used to charge the loop filter, the second and fourth current sources are used to discharge the loop filter.

15. A dual-mode phase/frequency detector for receiving an input frequency and an reference frequency, and generating an output signal indicating the phase difference between the input frequency and the reference frequency, the dual-mode phase/frequency detector comprising:

a digital phase/frequency detector for receiving the input frequency and the reference frequency, and outputting a digital signal corresponding to the phase difference between the input frequency and the reference frequency;

an analog phase/frequency detector for receiving the input frequency and the reference frequency, and outputting an analog signal corresponding to the phase difference between the input frequency and the reference frequency, the analog phase/frequency detector comprising an analog multiplier to generate the analog signal;

a charge pump, coupled to the digital phase/frequency detector and the analog phase/frequency detector, for initially generating the output signal based on the digital signal and then later generating the output signal based on the analog signal.

16. A dual-mode phase/frequency detector according to claim 15, wherein the charge pump initially generates the output signal based on the digital signal and then after a predetermined period of time generating the output signal based on the analog signal.

17. A dual-mode phase/frequency detector according to claim 15, wherein the charge pump initially generates the output signal based on the digital signal, and then generates the output signal based on the analog signal when the reference frequency is within a predetermined frequency range.

18. A dual-mode phase/frequency detector according to claim 15, further comprising a control unit for controlling the digital phase/frequency detector and the analog phase/frequency detector, wherein initially the control unit selects the digital phase/frequency detector to output the digital signal to the charge pump, and then later the control unit selects the analog phase/frequency detector to output the analog signal to the charge pump.

19. A dual-mode phase/frequency detector according to claim 18, wherein the control unit selects the analog phase/frequency detector to output the analog signal to the charge pump according to whether a predetermined period of time has lapsed.

20. A dual-mode phase/frequency detector according to claim 18, wherein the control unit selects the analog phase/frequency detector to output the analog signal to the charge pump according to whether the reference frequency is within a predetermined frequency range.

* * * * *